US009972595B2

(12) United States Patent
Antoku et al.

(10) Patent No.: US 9,972,595 B2
(45) Date of Patent: May 15, 2018

(54) BONDING WIRE FOR HIGH-SPEED SIGNAL LINE

(71) Applicant: TANAKA DENSHI KOGYO K.K., Chiyoda-ku, Tokyo (JP)

(72) Inventors: Yuki Antoku, Saga-ken (JP); Kazuhiko Yasuhara, Saga-ken (JP); Jun Chiba, Saga-ken (JP); Wei Chen, Saga-ken (JP); Junichi Okazaki, Saga-ken (JP); Nanako Maeda, Saga-ken (JP)

(73) Assignee: TANAKA DENSHI KOGYO K.K., Tokyo (JP)

( * ) Notice: Subject to any disclaimer, the term of this patent is extended or adjusted under 35 U.S.C. 154(b) by 642 days.

(21) Appl. No.: 14/142,152

(22) Filed: Dec. 27, 2013

(65) Prior Publication Data
US 2014/0302317 A1    Oct. 9, 2014

(51) Int. Cl.
*H01L 23/00*    (2006.01)

(52) U.S. Cl.
CPC .............. *H01L 24/45* (2013.01); *H01L 24/43* (2013.01); *H01L 24/05* (2013.01); *H01L 24/48* (2013.01);
(Continued)

(58) Field of Classification Search
CPC . H01L 2224/45669; H01L 2224/45664; H01L 2224/45644; H01L 2224/45124; H01L 2224/43848; H01L 2224/48644; H01L 2224/48669; H01L 2224/43; H01L 2224/48664; H01L 24/43; H01L 2224/45015; H01L 2224/48624; H01L 2224/45144; H01L 24/45; H01L 24/48; H01L 2224/05644; H01L 2224/45565; H01L 2224/45139; H01L 2224/05664; H01L 2224/45639; H01L 24/05; H01L 2224/05624; H01L 2223/6611; H01L 2224/05669; H01L 23/00; H01L 33/62; H01L 23/49; H01L 2924/01027; H01L 2924/01051; H01L 2924/01105; H01L 2224/48824; H01L 2924/01024; H01L 2924/01002; H01L 2924/01078; H01L 2924/01004; H01L 2224/456; H01L /;
(Continued)

(56) References Cited

U.S. PATENT DOCUMENTS 7,820,913 B2 * 10/2010 Uno ................ B23K 20/004
174/126.2
8,771,591 B1 * 7/2014 Bennett ................ C22C 5/06
420/503

(Continued)

FOREIGN PATENT DOCUMENTS

| JP | 2013-004781 A | 1/2013 |
| JP | 2013-033811 A | 2/2013 |
| KR | 10-2009-0086448 A | 8/2009 |

OTHER PUBLICATIONS

Korea Patent Office, "Office Action for KR 10-2013-0154699," dated Dec. 29, 2015.

*Primary Examiner* — Scott R. Walshon
(74) *Attorney, Agent, or Firm* — Manabu Kanesaka

(57) ABSTRACT

A bonding wire for a high-speed signal line for connecting a pad electrode of a semiconductor device and a lead electrode on a circuit board contains palladium (Pd), platinum (Pt), silver (Ag), and a trace additive element.

9 Claims, 3 Drawing Sheets

(52) U.S. Cl.
CPC ............... *H01L 2223/6611* (2013.01); *H01L 2224/05624* (2013.01); *H01L 2224/05644* (2013.01); *H01L 2224/05664* (2013.01); *H01L 2224/05669* (2013.01); *H01L 2224/43* (2013.01); *H01L 2224/43848* (2013.01); *H01L 2224/45015* (2013.01); *H01L 2224/45124* (2013.01); *H01L 2224/45139* (2013.01); *H01L 2224/45144* (2013.01); *H01L 2224/45565* (2013.01); *H01L 2224/45639* (2013.01); *H01L 2224/48624* (2013.01); *H01L 2224/48644* (2013.01); *H01L 2224/48664* (2013.01); *H01L 2224/48669* (2013.01); *H01L 2924/00011* (2013.01); *Y10T 428/2958* (2015.01)

(58) Field of Classification Search
CPC ..... Y10T 428/2958; B21C 3/00; B21C 37/04; B21C 37/042; C22C 5/04; C22C 9/00; C22C 5/08; C22C 9/02; C22C 5/02; C22C 5/06; C22C 21/02; C22C 5/00; B32B 15/01; H05K 1/02; H05K 3/24; H05K 3/28; C25D 7/06; C25D 5/10; C30B 29/52

USPC ............... 420/503, 504, 502, 505, 506, 501; 72/274, 286; 428/389; 174/126.2, 261; 257/99, 98, 787, 738; 438/200

See application file for complete search history.

(56) References Cited

U.S. PATENT DOCUMENTS

| | | | |
|---|---|---|---|
| 2002/0036355 A1* | 3/2002 | Young | H01L 23/26 257/787 |
| 2003/0183834 A1* | 10/2003 | Kohmoto | H01L 31/0203 257/98 |
| 2004/0014266 A1* | 1/2004 | Uno | B21C 37/042 438/200 |
| 2009/0188696 A1* | 7/2009 | Uno | B23K 20/004 174/126.2 |
| 2012/0032329 A1* | 2/2012 | Shigihara | H01L 24/05 257/738 |

\* cited by examiner

BONDING WIRE FOR HIGH-SPEED SIGNAL LINE

RELATED APPLICATIONS

The present application is based on, and claims priority from, Japanese Application No. JP2013-079513 filed Apr. 5, 2013, the disclosure of which is hereby incorporated by reference herein in its entirety.

BACKGROUND OF THE INVENTION

Field of the Invention

The present invention relates to bonding wires for high-speed signal lines that are used for connecting pad electrodes of semiconductor devices and lead electrodes on circuit boards and, more particularly, to a bonding wire for a high-speed signal line using a frequency of 1 to 15 GHz.

Description of the Related Art

Recently, with the development of manufacturing technology of semiconductor devices, it has become increasingly common to mount, in cellular phones and the like, semiconductor integrated circuit devices for high-speed signal lines using super-high frequencies exceeding a several GHz band. Conventionally, high-purity gold bonding wires with purity of 99.99 mass % or more have been commonly used for high-frequency transmission. However, when the normal bonding wire is used to connect the semiconductor device for the high-speed signal line using the super-high frequency and an wiring electrode and the like, in a several GHz to over 10 GHz band, high-frequency resistance by a super-high frequency signal increases further since the super-high frequency signal flows through a skin layer of the bonding wire. For this reason, receiving sensitivity, transmission output and the like are reduced when the high-purity gold bonding wire is used.

Therefore, examination of a high-purity silver (Ag) wire having purity of 99.99% and having an electric specific resistance value of 1.6 μΩcm and the like was made, as compared with high-purity gold (Au) having an electric specific resistance value of 2.4 μΩcm. However, bulk high-purity silver (Ag) is too soft to undergo a manufacturing process of the bonding wire, that is, melting, casting, cleaning, and continuous wire drawing. Further, silver (Ag) is sulfurized in the atmosphere, and a silver sulfide ($Ag_2S$) film is formed on the skin layer of the bonding wire. For this reason, the pure silver bonding wire has not been used as it is for the high-frequency transmission, in which the signal flows through the skin layer having the thickness of several μm, and the pure silver bonding wire is made suitable for practical use only after pure gold plating, as disclosed in Japanese Unexamined Patent Application Publication No. 2003-59963. With the pure silver bonding wire, strong silver sulfide ($Ag_2S$) hardens a molten ball at the time of forming the molten ball to be used for ball bonding, and therefore, it is not possible to form the stable molten ball, before being used as the high-speed signal line using the super-high frequency.

Meanwhile, a bonding wire of an Ag—Au binary alloy, in which 10000 to 55000 mass ppm of Au and 1 to 100 mass ppm of Bi are added to Ag, and further, a bonding wire of an Ag—Au—Pd ternary alloy, in which 20000 mass ppm or less of Pd is added to the above-described wire, have been developed (Japanese Unexamined Patent Application Publication No. 2012-49198), for the purpose of preventing electric specific resistance of Ag, having high electroconductivity, from being reduced substantially, and allowing the electric specific resistance of Ag to be 3.1 μΩcm or less, which is the same level as that of the Au wire that has purity of 99% and that is widely used at present. Here, an addition amount of Pd is 20000 mass ppm or less because "when the addition amount is more than 20000 mass ppm, hardness of a ball is increased and pad damage is caused at the time of ball bonding (refer to paragraph 0021 of Japanese Unexamined Patent Application Publication No. 2012-49198).

Moreover, such a wire for ball bonding is disclosed that contains a total of 5 to 500 wt. ppm of two or more elements chosen from Ca, Cu, Gd and Sm, a total of 0.5 to 5.0 wt. % of one or more element chosen from Pd and Au, and the balance being Ag and inevitable impurities (Japanese Unexamined Patent Application Publication No. 2012-151350). However, this bonding wire is a wire for bonding (W) that is used for connecting an Ni/Pd/Au coated electrode of a semiconductor device and conductor wiring of a circuit wiring board by a ball bonding method, and is not for joining a pad electrode of an Al alloy (Al—Si—Cu or the like). This is because "a joined portion of Al and Ag is likely to corrode" (refer to paragraph 0015 of Japanese Unexamined Patent Application Publication No. 2012-151350).

SUMMARY OF THE INVENTION

Problem to be Solved by the Invention

It is an object of the present invention to provide a bonding wire for a high-speed signal line, formed by an Ag—Pd—Pt three-element alloy or an Ag—Pd—Pt ternary alloy, that is able to transmit a stable super-high frequency signal in a several GHz band through a highly-concentrated pure silver layer having the uniform thickness on its outermost peripheral layer, formed by allowing the highly-concentrated pure silver layer to be newly segregated on the surface of the bonding wire, while using composition of the Ag—Pd—Pt three-element alloy or the Ag—Pd—Pt ternary alloy with excellent bonding properties.

Means of Solving the Problems

A bonding wire for a high-speed signal line, for solving the above-described problems of the present invention, is for connecting a pad electrode of a semiconductor device and a lead electrode on a circuit board, and is formed by an Ag—Pd—Pt ternary alloy containing a trace additive element, in which the bonding wire is formed by a three-element alloy containing 0.8 to 2.5 mass % of palladium (Pd), 0.1 to 0.7 mass % of platinum (Pt), and a balance being silver (Ag) with purity of 99.99 mass % or more, and in which cross section of the bonding wire is formed by a skin film and a core, the skin film being formed by a continuously-cast outer skin layer and a surface segregation layer that is on the outer skin layer and is formed by an alloy having a higher content of silver (Ag) than that of the core.

Further, a bonding wire for a high-speed signal line, for solving the above-described problems of the present invention, is for connecting a pad electrode of a semiconductor device and a lead electrode on a circuit board, and is formed by an Ag—Pd—Pt ternary alloy containing a trace additive element, in which the bonding wire is formed by a ternary alloy containing 0.8 to 2.5 mass % of palladium (Pd), 0.1 to 0.7 mass % of platinum (Pt), at least one or more of rhodium (Rh), ruthenium (Ru), iridium (Ir), copper (Cu), nickel (Ni), iron (Fe), magnesium (Mg), zinc (Zn), aluminum (Al), manganese (Mn), indium (In), silicon (Si), germanium (Ge), tin (Sn), beryllium (Be), bismuth (Bi), selenium (Se), cerium (Ce), titanium (Ti), yttrium (Y), calcium (Ca), lanthanum (La), europium (Eu), and antimony (Sb), a total of the trace additive element being 5 to 300 mass ppm, and a balance being silver (Ag) with purity of 99.99 mass % or more, and in which cross section of the bonding wire is formed by a skin film and a core, the skin film being formed by a continuously-cast outer skin layer and a surface segregation layer that is on the outer skin layer and is formed by an alloy having a higher content of silver (Ag) than that of the core.

Furthermore, according to one of the preferable aspects of the bonding wire for the high-speed signal line that is formed by an Ag—Pd—Pt three-element alloy or the Ag—Pd—Pt ternary alloy, for solving the above-described problems of the present invention, a ratio of palladium (Pd) to platinum (Pt) is within a range of 5:1 to 10:1 and, more preferably, within a range of 7:1 to 10:1. This is because the bonding properties of the bonding wire become stable.

Furthermore, according to one of the preferable aspects of the bonding wire for the high-speed signal line that is formed by the Ag—Pd—Pt three-element alloy or the Ag—Pd—Pt ternary alloy, for solving the above-described problems of the present invention, the high-speed signal has a frequency of 1 to 15 GHz.

Furthermore, according to one of the preferable aspects of the bonding wire for the high-speed signal line that is formed by the Ag—Pd—Pt three-element alloy or the Ag—Pd—Pt ternary alloy, for solving the above-described problems of the present invention, the pad electrode is formed by an aluminum (Al) metal with purity of 99.9 mass % or more or an aluminum (Al) alloy formed by 0.5 to 2.0 mass % of silicon (Si) or copper (Cu) and a balance being aluminum (Al) with purity of 99.9 mass % or more.

Furthermore, according to one of the preferable aspects of the bonding wire for the high-speed signal line that is formed by the Ag—Pd—Pt three-element alloy or the Ag—Pd—Pt ternary alloy, for solving the above-described problems of the present invention, the pad electrode is an electrode pad whose outer layer is gold (Au), palladium (Pd), or platinum (Pt).

It should be noted that, the bonding wire for the high-speed signal line that is formed by the Ag—Pd—Pt three-element alloy or the Ag—Pd—Pt ternary alloy, for solving the above-described problems of the present invention, is subjected to a cold wire drawing process by a diamond die continuously with reduction of area of 99% or more, and thereafter subjected to refining heat treatment so as to adjust mechanical properties of the bonding wire, similarly to a pure gold bonding wire.

(Main Additive Element)

According to the present invention, silver (Ag) with purity of 99.99 mass % or more is used as the balance, in order to cause surface segregation of the alloy having a high content of silver (Ag) without fail. When the purity is lower, variations in the thickness of the surface segregation layer of the alloy having the high content of silver (Ag) may be caused, due to the influence of impurities.

With the conventional pure silver bonding wire, silver (Ag) is ionized on the surface of high-purity silver (Ag) in the atmosphere, and combines with hydrogen sulfide in the atmosphere to become sulfide. The pure silver bonding wire dislikes this sulfide since the sulfide is more stable than oxide. With the sulfide, an unstable silver sulfide layer is first formed on the surface of the pure silver wire, and then the silver sulfide layer grows to form a strong silver sulfide ($Ag_2S$) film having the thickness of several nm on the surface of the pure silver bonding wire. Moreover, it has been considered that a sulfur compound existing in its skin layer moves along crystal grain boundaries into the pure silver bonding wire, to hinder the bonding properties. However, it has been found out that, when there is the surface segregation layer of a silver alloy, having a high concentration of silver (Ag) and having higher sulfur resistance than that of pure silver, it is possible to prevent the sulfur compound on the surface of the silver alloy from moving into the inside, and to prevent the strong silver sulfide ($Ag_2S$) film from being formed on the surface of the silver alloy.

When palladium (Pd) in the range of 0.8 to 2.5 mass % and platinum (Pt) in the range of 0.1 to 0.7 mass % are added to silver (Ag), both of these form solid solution uniformly in silver (Ag), and form the surface segregation layer of the silver alloy having the high concentration of silver (Ag).

According to the present invention, the highly-concentrated silver (Ag) layer by the surface segregation uses a surface phenomenon between a solid phase and a gas phase of a dilute alloy, and therefore, the surface segregation layer can be formed to have a fixed width layer around the perimeter of the bonding wire without fail.

Meanwhile, as the balance being silver (Ag) is 96.8 mass % or more, the core of this three-element alloy combines with sulfur in the atmosphere and sulfurized, although the degree of sulfurization is more modest than that of the high-purity silver (Ag) wire with purity of 99.99%. However, it has been found out that, under normal storage conditions, the silver sulfide layer formed on the outermost surface of the bonding wire of the three-element alloy does not move along the crystal grain boundaries into the wire, and does not affect the bonding properties, as will be described later. High-purity silver (Ag) and high-purity palladium (Pd) are surface segregated, high-purity silver (Ag) and high-purity platinum (Pt) are also surface segregated, and atomic radii of palladium (Pd) and platinum (Pt) are closer. Thus, when high-purity silver (Ag) added with palladium (Pd) and gold (Au) is melted and cast, a layer of highly-concentrated silver (Ag) is formed in a doughnut shape near the skin layer. When a cold continuous wire drawing process is performed in a manufacturing process of the bonding wire by cooling it with water or the like, while maintaining this highly-concentrated layer, the diameter of the highly-concentrated layer is reduced in proportion to the wire diameter of a fine wire. When the diameter of the continuously cast wire having the diameter of 8 mm is reduced until the bonding wire having the diameter of 20 μm is obtained (reduction of area of 99.9% or more), the highly-concentrated layer of silver (Ag) having the thickness of several nm or less from the surface remains on the outer skin of the bonding wire in theory. In actuality, the highly-concentrated layer of silver (Ag), as illustrated in FIG. 1, is observed in the wire drawing process of the wire having the diameter of 20 μm.

In general, it is considered that the high-frequency signal of several GHz flows through an outer layer having the thickness of about 1 μm, and the higher the frequency is, the closer to the surface the signal flows. Therefore, even the modest amount of highly-concentrated layer of silver (Ag) can increase a signal amount, and allow a signal waveform to be more stable, as compared with the case where there is no highly-concentrated layer of silver (Ag).

0.8 to 2.5 mass % of palladium (Pd) is added according to the present invention in order to obtain the bonding properties most suitable for a high-frequency signal line, and to facilitate the surface segregation of pure silver (Ag), due to a co-doping effect with platinum (Pt). The surface segregation is caused without fail when the addition amount of palladium (Pd) is within the above-described range. When the addition amount of palladium (Pd) is more than 2.5 mass %, specific resistance of the bonding wire increases, which is not appropriate to the high-frequency signal line. Further, when the addition amount of palladium (Pd) is more than 2.5 mass %, hardness of palladium (Pd) increases significantly. Thus, when a free air ball (FAB) is formed, crystal grains in the molten ball harden and the bonding properties most suitable for the high-frequency signal line cannot be obtained. On the contrary, when the addition amount of palladium (Pd) is less than 0.8 mass %, silver (Ag) is sulfurized easily, and the segregation layer cannot be formed sufficiently. Therefore, the range of the addition amount of palladium (Pd) is allowed to be 0.8 to 2.5 mass %.

0.1 to 0.7 mass % of platinum (Pt) is added according to the present invention in order to obtain the bonding properties most suitable for the high-frequency signal line, and to facilitate the surface segregation of pure silver (Ag), due to a co-doping effect with palladium (Pd). The surface segregation is caused without fail when the addition amount of platinum (Pt) is within the above-described range. When the addition amount of platinum (Pt) is more than 0.7 mass %, the specific resistance of the bonding wire increases, which is not appropriate to the high-frequency signal line. On the contrary, when the addition amount of platinum (Pt) is less than 0.1 mass %, silver (Ag) is sulfurized easily, and the segregation layer cannot be formed sufficiently. Therefore, the range of the addition amount of platinum (Pt) is allowed to be 0.1 to 0.7 mass %.

Further, it is more preferable that a ratio of palladium (Pd) to platinum (Pt) is within the range of 5:1 to 10:1. This is because, when the ratio of palladium (Pd) to platinum (Pt) is less than 5:1, it is likely that the wire itself hardens, and a loop is difficult to be formed. On the contrary, when the ratio of palladium (Pd) to platinum (Pt) is more than 10:1, it is likely that the shape of the FAB becomes unstable. Therefore, the range of 7:1 to 10:1 is more preferable in order to obtain the stable bonding properties.

(Trace Additive Element)

The Ag—Pd—Pt ternary alloy according to the present invention is the alloy in which at least one of rhodium (Rh), ruthenium (Ru), iridium (Ir), copper (Cu), nickel (Ni), iron (Fe), magnesium (Mg), zinc (Zn), aluminum (Al), manganese (Mn), indium (In), silicon (Si), germanium (Ge), tin (Sn), beryllium (Be), bismuth (Bi), selenium (Se), cerium (Ce), titanium (Ti), yttrium (Y), calcium (Ca), lanthanum (La), europium (Eu), and antimony (Sb) is added by 5 to 300 mass ppm in total. These trace additive elements are chosen because these are effective for the bonding properties, although the surface segregation layer of the Ag—Pd—Pt three-element alloy is not changed by these. Specifically, these are effective for bondability between the molten ball and a pad electrode of the aluminum (Al) metal or the aluminum (Al) alloy and, in particular, stability over a long period of time. In addition, when the element of rhodium (Rh), ruthenium (Ru), iridium (Ir), copper (Cu), nickel (Ni), iron (Fe), magnesium (Mg), zinc (Zn), aluminum (Al), manganese (Mn), indium (In), silicon (Si), germanium (Ge), tin (Sn), beryllium (Be), bismuth (Bi), selenium (Se), cerium (Ce), titanium (Ti), yttrium (Y), calcium (Ca), lanthanum (La), europium (Eu) or antimony (Sb) is added in the amount within a predetermined range to the Ag—Pd—Pt three-element alloy, flexibility of the bonding wire is increased without deteriorating the shape of the FAB. However, when the total amount of these elements is less than 5 mass ppm, the addition does not produce an effect, and when the total amount of these elements is more than 300 mass ppm, the crystal grains in the molten ball at the time of forming the FAB are hardened too much, and chip cracking is caused. Thus, at least one of rhodium (Rh), ruthenium (Ru), iridium (Ir), copper (Cu), nickel (Ni), iron (Fe), magnesium (Mg), zinc (Zn), aluminum (Al), manganese (Mn), indium (In), silicon (Si), germanium (Ge), tin (Sn), beryllium (Be), bismuth (Bi), selenium (Se), cerium (Ce), titanium (Ti), yttrium (Y), calcium (Ca), lanthanum (La), europium (Eu), and antimony (Sb) is allowed to be added in the range of 5 to 300 mass ppm in total. In the normal bonding wire to be used, the addition amount is 100 mass ppm or less in most cases.

Incidentally, it is preferable that the pad electrode is formed by an electrode pad whose outer layer is gold (Au), palladium (Pd), or platinum (Pt). This is because the bonding wire of the Ag—Pd—Pt three-element alloy or the Ag—Pd—Pt ternary alloy, according to the present invention, has the excellent bondability with the FAB.

Effects of the Invention

It is possible for the bonding wire of the Ag—Pd—Pt three-element alloy or the Ag—Pd—Pt ternary alloy, according to the present invention, to cause the surface segregation of the highly-concentrated silver (Ag) layer that is suitable for the transmission of a high-speed signal, without fail. As the highly-concentrated silver (Ag) layer is added to the core of the Ag—Pd—Pt three-element alloy or the Ag—Pd—Pt ternary alloy, it is possible to form a signal layer of the silver-rich alloy that is more stable and is more suitable for the transmission of the high-frequency signal of several GHz to over 10 GHz, as compared with the conventional bonding wire.

With the bonding wire of the Ag—Pd—Pt three-element alloy or the Ag—Pd—Pt ternary alloy, according to the present invention, the thickness of the highly-concentrated silver (Ag) layer is thin. Therefore, its mechanical strength is similar to that of the conventional excellent bonding wire, and its bonding properties such as FAB properties and loop properties basically compare favorably with those of the conventional bonding wire. However, there is such an additional effect that the bondability between the molten ball and the pad electrode is more excellent than that of the conventional bonding wire. When the pad electrode has an outer layer formed by gold (Au), palladium (Pd) or platinum (Pt), in particular, its bonding strength is stable.

With the bonding wire of the Ag—Pd—Pt three-element alloy or the Ag—Pd—Pt ternary alloy, according to the present invention, the addition amount of palladium (Pd), affecting the mechanical strength of the bonding wire, is 2.5 mass % or less, and therefore, the crystal grains in the molten ball at the time of forming the FAB are not hardened too much. Even when a soft aluminum pad, formed by the aluminum (Al) metal with purity of 99.9 mass % or more or the aluminum (Al) alloy formed by 0.5 to 2.0 mass % of silicon (Si) or copper (Cu) and the balance being aluminum (Al) with purity of 99.9 mass % or more, is used with the bonding wire of the Ag—Pd—Pt three-element alloy or the Ag—Pd—Pt ternary alloy, according to the present invention, neither chip cracking nor pad peeling is caused by the bonding wire of the present invention, because the content of palladium (Pd) is small. As a result of this, migration is not caused on a bonded interface, even after being left to stand at high temperature, and an effect of transmitting the high-frequency signal stably can be produced.

DESCRIPTION OF THE EMBODIMENT

Figure 1:
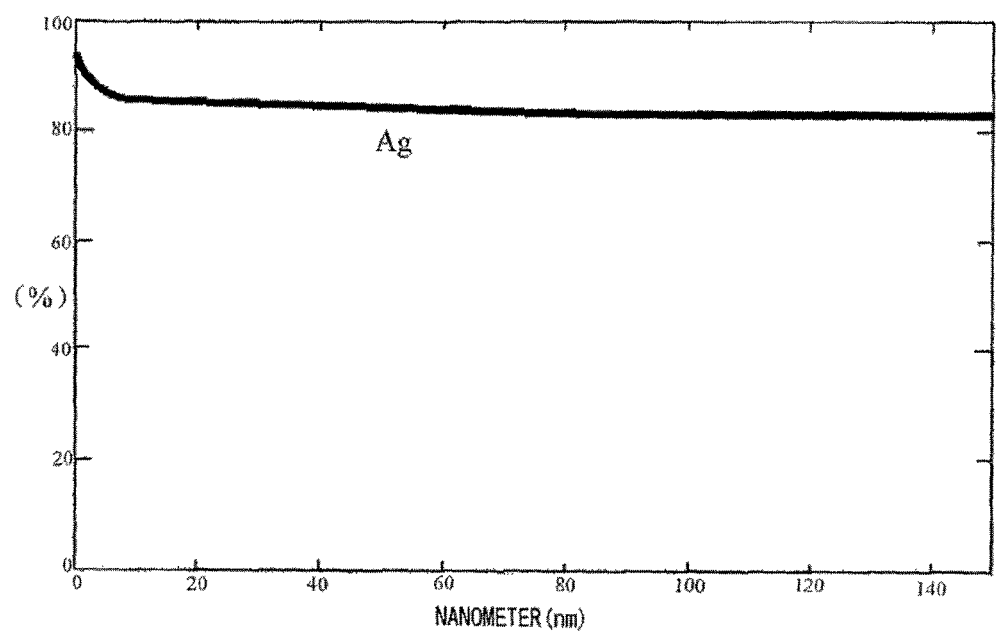
FIG. 1 is a cross-sectional schematic view illustrating distribution of a highly-concentrated silver (Ag) layer of the present invention.

Ag—Pd—Pt ternary alloys having element composition as illustrated in Table 1 (each containing silver (Ag) with purity of 99.99 mass % or more added with 5 to 300 ppm of a trace additive element of rhodium (Rh), ruthenium (Ru), iridium (Ir), copper (Cu), nickel (Ni), iron (Fe), magnesium (Mg), zinc (Zn), aluminum (Al), manganese (Mn), indium (In), silicon (Si), germanium (Ge), tin (Sn), beryllium (Be), bismuth (Bi), selenium (Se), cerium (Ce), titanium (Ti), yttrium (Y), calcium (Ca), lanthanum (La), europium (Eu) or antimony (Sb)) were melted and continuously cast under an inert atmosphere, to have the diameter of 8 mm, similarly to a normal pure gold bonding wire. The continuously-cast thick wires were continuously subjected to a cold and wet continuous wire drawing process by a diamond die until the diameter is reduced to 20 μm as a final wire diameter, that is, reduction of area is 99.99% or more, and were subjected to predetermined refining heat treatment, so as to manufacture bonding wires 1 to 38 having the wire diameter of 20 μM (hereinafter referred to as "implementation products") according to the present invention.

Examples 1 to 14 are the implementation products according to claim 1, examples 15 to 38 are the implementation products according to claim 2, and examples 8 to 14 and 27 to 38 are the implementation products according to claim 3.

TABLE 1

| | No. | Main element mass % | | | Trace additive element mass % | | | | | | | | | | |
|---|---|---|---|---|---|---|---|---|---|---|---|---|---|---|---|
| | | Ag | Pd | Pt | Rh | Ru | Ir | Cu | Ni | Fe | Mg | Zn | Al | Mn | In |
| Implementation products | 1 | Balance | 0.8 | 0.3 | 0 | 0 | 0 | 0 | 0 | 0 | 0 | 0 | 0 | 0 | 0 |
| | 2 | Balance | 1.0 | 0.3 | 0 | 0 | 0 | 0 | 0 | 0 | 0 | 0 | 0 | 0 | 0 |
| | 3 | Balance | 1.2 | 0.6 | 0 | 0 | 0 | 0 | 0 | 0 | 0 | 0 | 0 | 0 | 0 |
| | 4 | Balance | 1.5 | 0.1 | 0 | 0 | 0 | 0 | 0 | 0 | 0 | 0 | 0 | 0 | 0 |
| | 5 | Balance | 1.8 | 0.6 | 0 | 0 | 0 | 0 | 0 | 0 | 0 | 0 | 0 | 0 | 0 |
| | 6 | Balance | 2.0 | 0.5 | 0 | 0 | 0 | 0 | 0 | 0 | 0 | 0 | 0 | 0 | 0 |
| | 7 | Balance | 2.5 | 0.7 | 0 | 0 | 0 | 0 | 0 | 0 | 0 | 0 | 0 | 0 | 0 |
| | 8 | Balance | 0.8 | 0.1 | 0 | 0 | 0 | 0 | 0 | 0 | 0 | 0 | 0 | 0 | 0 |
| | 9 | Balance | 1.0 | 0.1 | 0 | 0 | 0 | 0 | 0 | 0 | 0 | 0 | 0 | 0 | 0 |
| | 10 | Balance | 1.2 | 0.2 | 0 | 0 | 0 | 0 | 0 | 0 | 0 | 0 | 0 | 0 | 0 |
| | 11 | Balance | 1.5 | 0.3 | 0 | 0 | 0 | 0 | 0 | 0 | 0 | 0 | 0 | 0 | 0 |
| | 12 | Balance | 1.8 | 0.2 | 0 | 0 | 0 | 0 | 0 | 0 | 0 | 0 | 0 | 0 | 0 |
| | 13 | Balance | 2.0 | 0.2 | 0 | 0 | 0 | 0 | 0 | 0 | 0 | 0 | 0 | 0 | 0 |
| | 14 | Balance | 2.2 | 0.3 | 0 | 0 | 0 | 0 | 0 | 0 | 0 | 0 | 0 | 0 | 0 |
| | 15 | Balance | 0.8 | 0.3 | 0 | 0 | 0 | 60 | 0 | 0 | 0 | 0 | 0 | 0 | 0 |
| | 16 | Balance | 0.8 | 0.3 | 0 | 0 | 0 | 0 | 60 | 0 | 0 | 0 | 0 | 0 | 0 |
| | 17 | Balance | 1.0 | 0.3 | 100 | 0 | 0 | 0 | 0 | 0 | 0 | 0 | 0 | 0 | 0 |
| | 18 | Balance | 1.0 | 0.3 | 0 | 0 | 0 | 0 | 0 | 0 | 0 | 0 | 0 | 0 | 0 |
| | 19 | Balance | 1.2 | 0.6 | 0 | 0 | 0 | 0 | 0 | 0 | 0 | 0 | 0 | 0 | 0 |
| | 20 | Balance | 1.2 | 0.6 | 0 | 0 | 0 | 0 | 0 | 0 | 0 | 0 | 0 | 0 | 0 |
| | 21 | Balance | 1.5 | 0.1 | 0 | 0 | 0 | 0 | 0 | 0 | 0 | 0 | 0 | 0 | 0 |
| | 22 | Balance | 1.5 | 0.1 | 0 | 0 | 0 | 0 | 0 | 0 | 0 | 0 | 0 | 0 | 0 |
| | 23 | Balance | 1.8 | 0.6 | 0 | 0 | 0 | 0 | 0 | 60 | 0 | 0 | 0 | 0 | 0 |
| | 24 | Balance | 1.8 | 0.6 | 0 | 0 | 0 | 0 | 0 | 0 | 0 | 0 | 0 | 0 | 0 |
| | 25 | Balance | 2.0 | 0.5 | 0 | 0 | 60 | 0 | 0 | 0 | 0 | 0 | 0 | 0 | 0 |
| | 26 | Balance | 2.0 | 0.5 | 0 | 50 | 0 | 0 | 0 | 0 | 0 | 0 | 0 | 0 | 0 |
| | 27 | Balance | 0.8 | 0.1 | 0 | 0 | 0 | 0 | 0 | 0 | 0 | 0 | 0 | 0 | 0 |
| | 28 | Balance | 0.8 | 0.1 | 0 | 0 | 0 | 0 | 0 | 0 | 0 | 0 | 0 | 0 | 0 |
| | 29 | Balance | 1.0 | 0.1 | 0 | 0 | 0 | 0 | 0 | 60 | 0 | 0 | 0 | 0 | 0 |
| | 30 | Balance | 1.0 | 0.1 | 0 | 0 | 0 | 0 | 0 | 0 | 0 | 0 | 0 | 0 | 0 |
| | 31 | Balance | 1.2 | 0.2 | 0 | 0 | 0 | 0 | 0 | 0 | 60 | 0 | 0 | 0 | 0 |
| | 32 | Balance | 1.2 | 0.2 | 0 | 0 | 0 | 0 | 0 | 0 | 0 | 0 | 50 | 0 | 0 |
| | 33 | Balance | 1.5 | 0.3 | 0 | 0 | 0 | 60 | 0 | 0 | 0 | 0 | 0 | 0 | 0 |
| | 34 | Balance | 1.5 | 0.3 | 0 | 0 | 0 | 0 | 60 | 0 | 0 | 0 | 0 | 0 | 0 |
| | 35 | Balance | 1.8 | 0.2 | 0 | 0 | 0 | 0 | 0 | 0 | 0 | 0 | 0 | 0 | 0 |
| | 36 | Balance | 1.8 | 0.2 | 0 | 0 | 0 | 0 | 0 | 0 | 0 | 60 | 0 | 0 | 0 |
| | 37 | Balance | 2.0 | 0.2 | 0 | 0 | 0 | 0 | 0 | 0 | 0 | 0 | 0 | 60 | 0 |
| | 38 | Balance | 2.0 | 0.2 | 0 | 0 | 0 | 0 | 0 | 0 | 0 | 0 | 0 | 0 | 60 |
| Comparison products | 39 | Balance | 0.5 | 0.5 | 0 | 0 | 0 | 0 | 0 | 0 | 0 | 0 | 0 | 0 | 0 |
| | 40 | Balance | 0.7 | 0.2 | 0 | 0 | 0 | 0 | 0 | 0 | 0 | 0 | 0 | 0 | 0 |
| | 41 | Balance | 0.5 | 1.5 | 0 | 0 | 0 | 0 | 0 | 0 | 0 | 0 | 0 | 0 | 0 |
| | 42 | Balance | 3.5 | 0.3 | 0 | 0 | 0 | 0 | 0 | 0 | 0 | 0 | 0 | 0 | 0 |
| | 43 | Balance | 2.7 | 1.0 | 0 | 0 | 0 | 0 | 0 | 0 | 0 | 0 | 0 | 0 | 0 |
| | 44 | Balance | 3.0 | 1.5 | 0 | 0 | 0 | 0 | 0 | 0 | 0 | 0 | 0 | 0 | 0 |
| | 45 | Balance | 1.5 | 0.3 | 550 | 0 | 0 | 0 | 0 | 0 | 0 | 0 | 0 | 0 | 0 |
| | 46 | Balance | 1.5 | 0.3 | 0 | 0 | 0 | 350 | 0 | 0 | 0 | 0 | 0 | 0 | 0 |
| | 47 | Balance | 1.5 | 0.3 | 0 | 0 | 0 | 0 | 0 | 0 | 0 | 0 | 0 | 0 | 0 |

TABLE 1-continued

|  | | Trace additive element mass % | | | | | | | | | | | | |
|---|---|---|---|---|---|---|---|---|---|---|---|---|---|---|
|  | No. | Si | Ge | Sn | Be | Bi | Se | Ce | Te | Y | Ca | La | Eu | Sb |
| Implementation products | 1 | 0 | 0 | 0 | 0 | 0 | 0 | 0 | 0 | 0 | 0 | 0 | 0 | 0 |
| | 2 | 0 | 0 | 0 | 0 | 0 | 0 | 0 | 0 | 0 | 0 | 0 | 0 | 0 |
| | 3 | 0 | 0 | 0 | 0 | 0 | 0 | 0 | 0 | 0 | 0 | 0 | 0 | 0 |
| | 4 | 0 | 0 | 0 | 0 | 0 | 0 | 0 | 0 | 0 | 0 | 0 | 0 | 0 |
| | 5 | 0 | 0 | 0 | 0 | 0 | 0 | 0 | 0 | 0 | 0 | 0 | 0 | 0 |
| | 6 | 0 | 0 | 0 | 0 | 0 | 0 | 0 | 0 | 0 | 0 | 0 | 0 | 0 |
| | 7 | 0 | 0 | 0 | 0 | 0 | 0 | 0 | 0 | 0 | 0 | 0 | 0 | 0 |
| | 8 | 0 | 0 | 0 | 0 | 0 | 0 | 0 | 0 | 0 | 0 | 0 | 0 | 0 |
| | 9 | 0 | 0 | 0 | 0 | 0 | 0 | 0 | 0 | 0 | 0 | 0 | 0 | 0 |
| | 10 | 0 | 0 | 0 | 0 | 0 | 0 | 0 | 0 | 0 | 0 | 0 | 0 | 0 |
| | 11 | 0 | 0 | 0 | 0 | 0 | 0 | 0 | 0 | 0 | 0 | 0 | 0 | 0 |
| | 12 | 0 | 0 | 0 | 0 | 0 | 0 | 0 | 0 | 0 | 0 | 0 | 0 | 0 |
| | 13 | 0 | 0 | 0 | 0 | 0 | 0 | 0 | 0 | 0 | 0 | 0 | 0 | 0 |
| | 14 | 0 | 0 | 0 | 0 | 0 | 0 | 0 | 0 | 0 | 0 | 0 | 0 | 0 |
| | 15 | 0 | 0 | 0 | 0 | 0 | 0 | 0 | 0 | 0 | 0 | 0 | 0 | 0 |
| | 16 | 0 | 0 | 0 | 0 | 0 | 0 | 0 | 0 | 0 | 0 | 0 | 0 | 0 |
| | 17 | 0 | 0 | 0 | 0 | 0 | 0 | 0 | 0 | 0 | 0 | 0 | 0 | 0 |
| | 18 | 0 | 0 | 0 | 0 | 100 | 0 | 0 | 0 | 0 | 0 | 0 | 0 | 0 |
| | 19 | 0 | 0 | 0 | 0 | 0 | 0 | 0 | 0 | 0 | 100 | 0 | 0 | 0 |
| | 20 | 0 | 0 | 0 | 0 | 0 | 0 | 0 | 0 | 0 | 0 | 100 | 0 | 0 |
| | 21 | 50 | 0 | 0 | 0 | 0 | 0 | 50 | 0 | 0 | 0 | 0 | 0 | 0 |
| | 22 | 0 | 0 | 0 | 10 | 0 | 0 | 0 | 0 | 25 | 0 | 0 | 0 | 0 |
| | 23 | 0 | 0 | 0 | 0 | 0 | 30 | 0 | 0 | 0 | 0 | 0 | 0 | 0 |
| | 24 | 0 | 0 | 0 | 0 | 0 | 60 | 0 | 15 | 0 | 0 | 0 | 0 | 0 |
| | 25 | 0 | 0 | 0 | 0 | 0 | 0 | 0 | 0 | 0 | 0 | 0 | 40 | 0 |
| | 26 | 0 | 0 | 0 | 0 | 0 | 0 | 0 | 0 | 0 | 0 | 50 | 0 | 0 |
| | 27 | 0 | 0 | 100 | 0 | 0 | 0 | 0 | 0 | 0 | 0 | 0 | 0 | 0 |
| | 28 | 0 | 0 | 0 | 0 | 0 | 0 | 0 | 0 | 0 | 0 | 0 | 100 | 0 |
| | 29 | 0 | 0 | 0 | 0 | 0 | 0 | 0 | 0 | 0 | 0 | 0 | 0 | 0 |
| | 30 | 0 | 60 | 0 | 0 | 0 | 0 | 0 | 0 | 0 | 0 | 0 | 0 | 0 |
| | 31 | 0 | 0 | 0 | 0 | 0 | 0 | 0 | 0 | 0 | 0 | 0 | 0 | 0 |
| | 32 | 0 | 0 | 0 | 0 | 0 | 0 | 0 | 0 | 0 | 0 | 0 | 0 | 0 |
| | 33 | 0 | 0 | 0 | 0 | 0 | 0 | 0 | 0 | 30 | 0 | 0 | 0 | 0 |
| | 34 | 0 | 0 | 0 | 0 | 0 | 0 | 30 | 0 | 0 | 0 | 0 | 0 | 0 |
| | 35 | 0 | 0 | 0 | 0 | 75 | 0 | 25 | 0 | 0 | 0 | 0 | 0 | 0 |
| | 36 | 0 | 0 | 0 | 10 | 0 | 0 | 0 | 0 | 0 | 0 | 0 | 0 | 0 |
| | 37 | 0 | 0 | 0 | 0 | 0 | 0 | 0 | 0 | 0 | 0 | 0 | 0 | 20 |
| | 38 | 0 | 0 | 0 | 0 | 0 | 0 | 0 | 0 | 0 | 40 | 0 | 0 | 0 |
| Comparison products | 39 | 0 | 0 | 0 | 0 | 0 | 0 | 0 | 0 | 0 | 0 | 0 | 0 | 0 |
| | 40 | 0 | 0 | 0 | 0 | 0 | 0 | 0 | 0 | 0 | 0 | 0 | 0 | 0 |
| | 41 | 0 | 0 | 0 | 0 | 0 | 0 | 0 | 0 | 0 | 0 | 0 | 0 | 0 |
| | 42 | 0 | 0 | 0 | 0 | 0 | 0 | 0 | 0 | 0 | 0 | 0 | 0 | 0 |
| | 43 | 0 | 0 | 0 | 0 | 0 | 0 | 0 | 0 | 0 | 0 | 0 | 0 | 0 |
| | 44 | 0 | 0 | 0 | 0 | 0 | 0 | 0 | 0 | 0 | 0 | 0 | 0 | 0 |
| | 45 | 0 | 0 | 0 | 0 | 0 | 0 | 0 | 0 | 0 | 0 | 0 | 0 | 0 |
| | 46 | 0 | 0 | 0 | 0 | 0 | 0 | 0 | 0 | 0 | 0 | 100 | 100 | 0 |
| | 47 | 0 | 0 | 0 | 0 | 0 | 0 | 0 | 0 | 0 | 0 | 0 | 0 | 0 |

Comparative Example

Similarly to the examples, bonding wires 39 to 47 as illustrated in Table 1, having element composition that is outside a composition range of the present invention were manufactured as comparison products (hereinafter referred to as "comparison products").

Incidentally, the comparison product 47 is formed by continuously casting (reducing the diameter of) an element wire obtained by subjecting the continuously-cast thick wire having the diameter of 8 mm, similar to those of the examples, to pickling by dilute nitric acid at 80° C., and does not have the surface segregation layer on its outer layer. Therefore, the comparison product 47 is different from the implementation products in that it is subjected to the pickling, although its composition is within the composition range of the present invention.

Incidentally, the refining heat treatment in the present invention and the comparative example is heat treatment for adjusting the bonding wire to have a predetermined elongation value, in the measurement by a tensile breaking testing machine, while adjusting temperature and speed in a tube furnace, similarly to the case of a pure gold wire. After the refining heat treatment, the highly-concentrated silver (Ag) layer segregated in the doughnut shape on the surface of the implementation product was not lost.

[Checking of Surface Segregation Layer]

The Ag—Pd—Pt three-element alloy having the composition of the implementation product 1 was continuously cast under the inert atmosphere to obtain the thick wire having the diameter of 8 mm. This thick wire was subjected to the continuous wire drawing process while being water-cooled, and subjected to the refining heat treatment so that a percentage of elongation becomes 4%, and the bonding wire having the diameter of 20 μm was obtained. With regard to the silver (Ag) element of the bonding wire, the Auger analysis was performed in the depth direction from its outer layer toward its center. The results are illustrated in FIG. 1.

As is clear from FIG. 1, it is found out that the surface segregation layer of highly-concentrated silver (Ag) exists from the surface of the implementation product to the depth of about 10 nm.

[Checking of Silver Sulfide]

The bonding wire of the implementation product 1 was left to stand in a room-temperature atmosphere for 30 days. Then, the thickness of the silver sulfide ($Ag_2S$) film at the outermost surface was measured by the Sequential Electrochemical Reduction Analysis, by using a sulfide film thickness measuring machine (QC-200 manufactured by Cermatronics Boeki Co., Ltd.). As a result of this, the silver sulfide ($Ag_2S$) film was not detected. This is illustrated by a thick black line (a curved line in an L shape) in FIG. 2.

The bonding wire of the comparison product 39 was left to stand similarly to the implementation product 1, and the thickness of the silver sulfide ($Ag_2S$) film was measured. As a result of this, the silver sulfide ($Ag_2S$) film was detected. This is illustrated by a line with diamond shape marks (a step-wise curved line) in FIG. 2.

Figure 2:
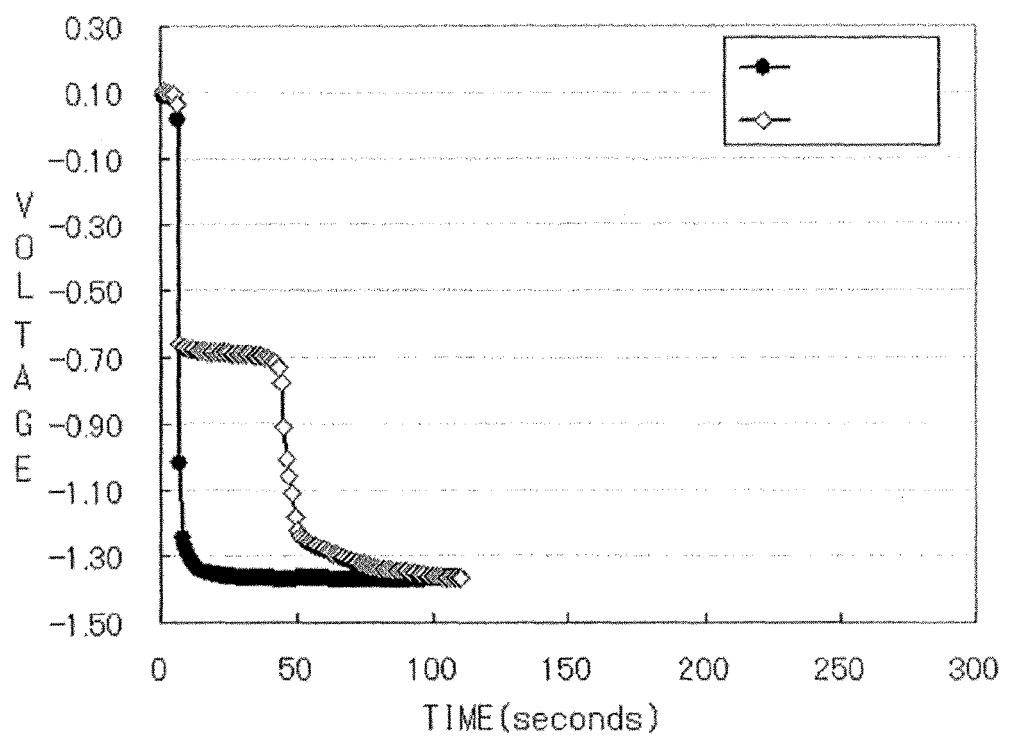
FIG. 2 is a view illustrating voltage changes of an implementation product 1 and a comparison product 39 over time in a graphical form.

FIG. 2 is a view illustrating voltage changes over time in a graphical form. With the comparison product 39 in which silver sulfide ($Ag_2S$) is formed, such a phenomenon occurs that the voltage does not change over time in a section where the voltage is −0.25 to −0.80 V. Meanwhile, with the bonding wire of the implementation product 1, the above-described step-wise phenomenon does not occur in the above-described section of the voltage, and the voltage changes over time. Thus, it is found out that silver sulfide ($Ag_2S$) is not formed in the outermost surface of the bonding wire of the implementation product 1.

In addition, the outermost surface of the implementation product 1 is subjected to qualitative analysis to check a detection amount of sulfur (S). This is illustrated in FIG. 3.

Figure 3:
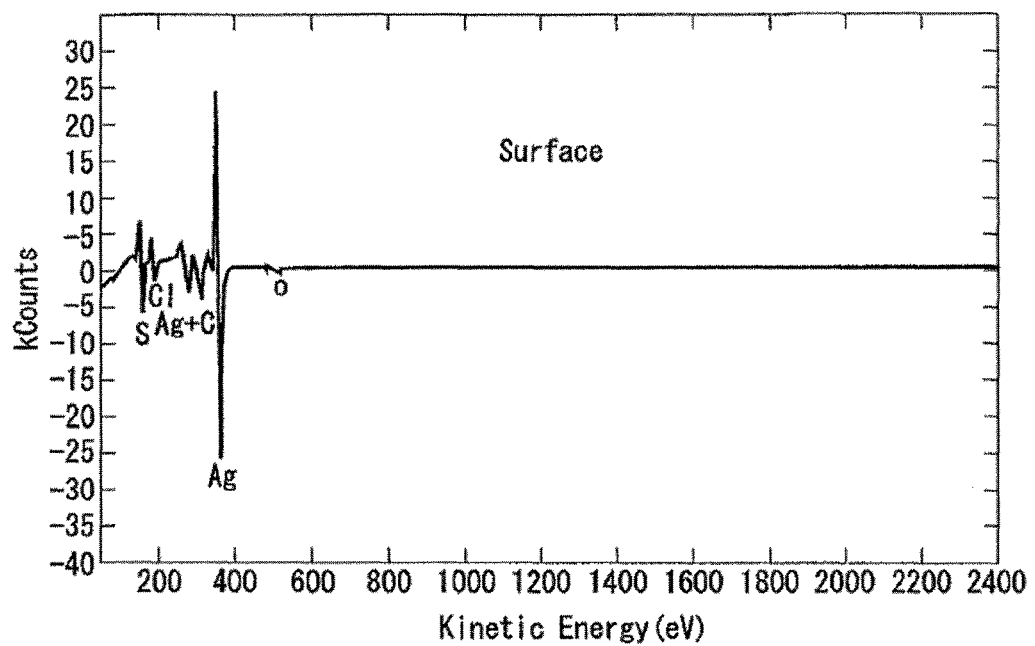
FIG. 3 illustrates results of qualitative analysis of the implementation product 1 near the outermost surface.

As illustrated in FIG. 3, it is found out that sulfur (S) exists in the outermost surface of the bonding wire of the implementation product 1. However, silver sulfide ($Ag_2S$) is not detected in the results in FIG. 2, and therefore, it is found out that sulfur (S) of the bonding wire of the implementation product 1 is in a state of the silver sulfide layer that is unstable and physically adsorbed, without reacting with silver (Ag) existing in the outermost surface and forming the strong silver sulfide ($Ag_2S$) film. Further, as is clear from FIG. 3, the metal element in the outermost surface of the bonding wire of the implementation product 1 is silver (Ag), without including palladium (Pd) or platinum (Pt), and substantially forms the highly-concentrated silver (Ag) layer, which is most suited for the high-speed signal layer.

[Aluminum Splash Test]

Each of the implementation products 1 to 38 and the comparison products 39 to 47 was set in a commercially-available wire bonder. Under an atmosphere of blowing nitrogen, the free air ball (FAB) was formed aiming at 38 μm on a 70 μm-square aluminum pad (having a gold (Au) layer with the thickness of 20 nm evaporated onto its surface), formed by an Al-1.0 mass % Si-0.5 mass % Cu alloy, on the surface of a dummy semiconductor IC (having a test pattern embedded in a wafer, which is abbreviated as "TEG"), and ball bonding was performed under the conditions of substrate heating temperature of 200° C., loop length of 5 mm, loop height of 220 μm, crimping ball diameter of 50 μm, and crimping ball height of 10 μm. With regard to a measurement method of the amount of aluminum splash, the crimping ball of each of the wires was observed from immediately above, by using a commercially available SEM, to measure the position of aluminum that protrudes to the maximum extent from the crimping ball, by setting the peripheral portion of the crimping ball as a base point. When the protruded amount of aluminum is less than 2 μm, it is judged as ⊚ (very good), when it is 2 μm or more and less than 4 μm, it is judged as ○ (good), and when it is 4 μm or more, it is judged as x (poor). Evaluation results of the aluminum splash test are illustrated in Table 2.

[Chip Damage Test]

In addition, chip damage of the samples was examined. According to a chip damage test, the aluminum pad was dissolved by aqueous sodium hydroxide, and then the chip was observed by the stereoscopic microscope. With regard to the "chip damage test" in Table 2, when there is a flaw or a crack, even if only slightly, it is judged as x (poor), and when there is neither flaw nor crack, it is judged as ○ (good). The results are illustrated in Table 2.

TABLE 2

|  | No. | Aluminum splash test | Chip damage test | Signal waveform deterioration test | Shear strength test of crimping ball |
|---|---|---|---|---|---|
| Implementation products | 1 | ⊚ | ○ | ○ | ○ |
|  | 2 | ⊚ | ○ | ○ | ○ |
|  | 3 | ⊚ | ○ | ○ | ○ |
|  | 4 | ⊚ | ○ | ○ | ○ |
|  | 5 | ⊚ | ○ | ○ | ○ |
|  | 6 | ⊚ | ○ | ○ | ⊚ |
|  | 7 | ○ | ○ | ○ | ⊚ |
|  | 8 | ⊚ | ○ | ○ | ○ |
|  | 9 | ⊚ | ○ | ○ | ○ |
|  | 10 | ⊚ | ○ | ○ | ○ |
|  | 11 | ⊚ | ○ | ○ | ○ |
|  | 12 | ⊚ | ○ | ○ | ○ |
|  | 13 | ⊚ | ○ | ○ | ⊚ |
|  | 14 | ○ | ○ | ○ | ⊚ |
|  | 15 | ⊚ | ○ | ○ | ○ |
|  | 16 | ⊚ | ○ | ○ | ○ |
|  | 17 | ⊚ | ○ | ○ | ○ |
|  | 18 | ⊚ | ○ | ○ | ○ |
|  | 19 | ⊚ | ○ | ○ | ○ |
|  | 20 | ⊚ | ○ | ○ | ○ |
|  | 21 | ⊚ | ○ | ○ | ○ |
|  | 22 | ⊚ | ○ | ○ | ○ |
|  | 23 | ⊚ | ○ | ○ | ○ |
|  | 24 | ⊚ | ○ | ○ | ○ |
|  | 25 | ⊚ | ○ | ○ | ⊚ |
|  | 26 | ⊚ | ○ | ○ | ⊚ |
|  | 27 | ⊚ | ○ | ○ | ○ |
|  | 28 | ⊚ | ○ | ○ | ○ |
|  | 29 | ⊚ | ○ | ○ | ○ |
|  | 30 | ⊚ | ○ | ○ | ○ |
|  | 31 | ⊚ | ○ | ○ | ○ |
|  | 32 | ⊚ | ○ | ○ | ○ |
|  | 33 | ⊚ | ○ | ○ | ○ |
|  | 34 | ⊚ | ○ | ○ | ○ |
|  | 35 | ⊚ | ○ | ○ | ○ |
|  | 36 | ⊚ | ○ | ○ | ○ |
|  | 37 | ⊚ | ○ | ○ | ⊚ |
|  | 38 | ⊚ | ○ | ○ | ⊚ |
| Comparison products | 39 | ⊚ | ○ | X | X |
|  | 40 | ⊚ | ○ | X | X |
|  | 41 | ○ | ○ | X | ○ |
|  | 42 | X | X | X | ⊚ |
|  | 43 | X | X | X | ⊚ |
|  | 44 | X | X | X | ⊚ |
|  | 45 | X | X | X | ⊚ |
|  | 46 | X | X | X | ⊚ |
|  | 47 | ⊚ | ○ | X | ⊚ |

[Signal Waveform Deterioration Test]

Next, a signal waveform deterioration test was performed by a four-terminal method. The implementation product wires and the comparison product wires (each having the wire diameter of 20 μm and the length of 100 mm) were used as the samples. At the time of measurement, a commercially-available function generator was used to propagate a pulse waveform of 10 GHz and 2 V to the implementation product wires and the comparison product wires, and the signal waveform was measured by a predetermined commercially-available digital oscilloscope and probe that can measure the pulse waveform in a 10 GHz band. A probe interval for the measurement was allowed to be 50 mm. With regard to a degree of signal waveform deterioration, a delay time of the output signal waveform propagating through the wire was measured, until it reached an input voltage value. From the results of the experiment, it is confirmed that the signal delay time of the conventional wire (15 ppm of Ca, 20 ppm of Eu, and 99.999 mass % of Au as the balance) is 20%. Thus, with regard to the judgment of the signal delay time, when the delay time is 20% or less of that of the conventional wire, it is judged as ○ (good), and when the delay time is more than 20%, it is judged as x (poor). Evaluation results of the signal waveform deterioration test for the implementation product wires and the comparison product wires are illustrated in Table 2.

[Shear Strength Test of Crimping Ball]

The members and the evaluation device that are similar to those used in the aluminum splash test were used to perform the bonding of each of the implementation product wires and the comparison product wires to a dedicated IC chip by using the wire bonder. With regard to the 100 products, "Multipurpose bondtester (BT) (Series 4000)" manufactured by Dage Japan Co., Ltd. was used to perform shear strength evaluation of the crimping ball at the time of the ball bonding. The results of the shear strength evaluation of the crimping ball are illustrated in Table 2.

In Table 2, "ball shear" means a shear load value of first bonding. ◉ (very good) means that the value is 12 kg/mm$^2$ or more, ○ (good) means that the value is 10 kg/mm$^2$ or more and less than 12 kg/mm$^2$, and x (poor) means that the value is less than 10 kg/mm$^2$ or ball stripping is caused.

It is found out that, as is clear from the results in Table 2, in the signal waveform deterioration test, no deterioration is found in any of the implementation products 1 to 38 according to the present invention, but the deterioration is found in all of the comparison products 39 to 47.

With regard to the aluminum splash test, the chip damage test and the shear strength test of the crimping ball, all the implementation products 1 to 38 according to the present invention have the excellent results. However, it is found out that the comparison products 39 and 40 have unfavorable results with regard to the shear strength test of the crimping ball, and the comparison products 42 to 46 have unfavorable results with regard to the aluminum splash test and the chip damage test.

INDUSTRIAL APPLICABILITY

The bonding wire of the present invention is most suitable for transmitting super-high frequency signals of several GHz to over 10 GHz, which has a wide variety of applications as the bonding wire for signals, suitable for transmitting the high-frequency signals.

What is claimed is:

1. A bonding wire for a high-speed signal line for connecting a pad electrode of a semiconductor device and a lead electrode on a circuit board, consisting essentially of:
   a trace additive element;
   0.8 to 2.5 mass % of palladium (Pd),
   0.1 to 0.7 mass % of platinum (Pt); and
   a remaining being silver (Ag) with purity of 99.99 mass % or more,
   wherein the bonding wire comprises a core and a skin region in a doughnut shape segregated on the core so that a high purity silver segregation layer covers a lower purity silver on a surface of the bonding wire, and
   the skin region contains an alloy having a higher content of silver (Ag) than a content of silver (Ag) in the core to thereby transmit super-high frequency.

2. The bonding wire for the high-speed signal line according to claim 1, wherein the skin region is a surface segregation layer.

3. A bonding wire for a high-speed signal line for connecting a pad electrode of a semiconductor device and a lead electrode on a circuit board, consisting essentially of:
   a trace additive element;
   0.8 to 2.5 mass % of palladium (Pd);
   0.1 to 0.7 mass % of platinum (Pt); and
   at least one element selected from the group consisting of rhodium (Rh), iridium (Ir), ruthenium (Ru), copper (Cu), nickel (Ni), iron (Fe), magnesium (Mg), zinc (Zn), aluminum (Al), indium (In), silicon (Si), germanium (Ge), beryllium (Be), bismuth (Bi), selenium (Se), cerium (Ce), yttrium (Y), lanthanum (La), calcium (Ca) and europium (Eu),
   wherein a total amount of the trace additive element is 5 to 300 mass ppm, and a remaining is silver (Ag) with purity of 99.99 mass % or more,
   the bonding wire comprises a core and a skin region in a doughnut shape segregated on the core so that a high purity silver segregation layer covers a lower purity silver on a surface of the bonding wire, and
   the skin region contains an alloy having a higher content of silver (Ag) than a content of silver (Ag) in the core to thereby transmit super-high frequency.

4. The bonding wire for the high-speed signal line according to claim 1, wherein a ratio of palladium (Pd) to platinum (Pt) is within a range of 5:1 to 10:1.

5. The bonding wire for the high-speed signal line according to claim 1, wherein the high-speed signal has a frequency of 1 to 15 GHz.

6. The bonding wire for the high-speed signal line according to claim 1, wherein the pad electrode comprises an aluminum (Al) metal with purity of 99.9 mass % or more or an aluminum (Al) alloy comprising 0.5 to 2.0 mass % of silicon (Si) or copper (Cu) and the remaining is aluminum (Al) with purity of 99.9 mass % or more.

7. The bonding wire for the high-speed signal line according to claim 1, wherein the pad electrode is an electrode pad whose outer layer is gold (Au), palladium (Pd), or platinum (Pt).

8. The bonding wire for the high-speed signal line according to claim 1, wherein a thickness of the skin region is 10 nm.

9. The bonding wire for the high-speed signal line according to claim 2, wherein a thickness of the surface segregation layer is 10 nm.

* * * * *